United States Patent
Kiguchi et al.

(10) Patent No.: US 11,500,015 B2
(45) Date of Patent: Nov. 15, 2022

(54) SHORT-CIRCUIT DETERMINING APPARATUS, SWITCH APPARATUS AND SHORT-CIRCUIT DETERMINING METHOD

(71) Applicant: FUJI ELECTRIC CO., LTD., Kanagawa (JP)

(72) Inventors: Ryoga Kiguchi, Tachikawa (JP); Kunio Matsubara, Hino (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 11 days.

(21) Appl. No.: 17/330,351

(22) Filed: May 25, 2021

(65) Prior Publication Data

US 2022/0003816 A1 Jan. 6, 2022

(30) Foreign Application Priority Data

Jul. 3, 2020 (JP) .............................. JP2020-115829

(51) Int. Cl.
*G01R 31/28* (2006.01)
*G01R 31/315* (2006.01)

(52) U.S. Cl.
CPC ....... *G01R 31/315* (2013.01); *G01R 31/2812* (2013.01)

(58) Field of Classification Search
CPC .............. G01R 31/2608; G01R 31/261; G01R 31/2612; G01R 31/2614; G01R 31/2616; G01R 31/2617; G01R 31/2619; G01R 31/00
See application file for complete search history.

(56) References Cited

U.S. PATENT DOCUMENTS

2018/0145668 A1* 5/2018 Chan ................ H03K 17/08122
2018/0309286 A1* 10/2018 Kaundinya .............. H02H 9/04

FOREIGN PATENT DOCUMENTS

| JP | 2001169533 A | 6/2001 |
| JP | 2008301617 A | 12/2008 |
| JP | 2013231601 A | 11/2013 |

* cited by examiner

*Primary Examiner* — Tung X Nguyen

(57) ABSTRACT

Provided is a short-circuit determining apparatus comprising: a sensor configured to detect a time change of a main current flowing between a first main terminal and a second main terminal of a switching device having a control terminal, the first main terminal and the second main terminal; an integration unit configured to integrate an output of the sensor; a polarity determining unit configured to determine a polarity of the output of the sensor; and a short-circuit determining unit configured to determine a short-circuit of the switching device, based on a comparison result of an output of the integration unit and a short-circuit determination reference value according to a determination result of the polarity.

20 Claims, 6 Drawing Sheets

SHORT-CIRCUIT DETERMINING APPARATUS, SWITCH APPARATUS AND SHORT-CIRCUIT DETERMINING METHOD

The contents of the following Japanese patent application are incorporated herein by reference:
NO. 2020-115829 filed in JP on Jul. 3, 2020

BACKGROUND

1. Technical Field

The present invention relates to a short-circuit determining apparatus, a switch apparatus, and a short-circuit determining method.

2. Related Art

Patent Document 1 describes that "a voltage between terminals of a Rogowskii coil 7 is integrated, and an element is determined as being short-circuited when it is detected that a value of an integral output is equal to or greater than any constant level".

CITATION LIST

Patent Document
Patent Document 1: Japanese Patent Application Publication No. 2001-169533

SUMMARY OF INVENTION

Technical Problem

According to an electric power converter of Patent Document 1, a switching device is determined as being short-circuited by comparing the integral output of the voltage between terminals of the Rogowskii coil with one reference value. However, it is needed to appropriately determine the short-circuit of the switching device depending on situations.

Technical Solution (Item 1) A first aspect of the present invention provides a short-circuit determining apparatus. The short-circuit determining apparatus may comprise a sensor configured to detect a time change of a main current flowing between a first main terminal and a second main terminal of a switching device having a control terminal, the first main terminal and the second main terminal. The short-circuit determining apparatus may comprise an integration unit configured to integrate an output of the sensor. The short-circuit determining apparatus may comprise a polarity determining unit configured to determine a polarity of the output of the sensor. The short-circuit determining apparatus may comprise a short-circuit determining unit configured to determine a short-circuit of the switching device, based on a comparison result of an output of the integration unit and a short-circuit determination reference value according to a determination result of the polarity.

(Item 2) The short-circuit determining apparatus may further comprise a reference output unit configured to output the short-circuit determination reference value to the short-circuit determining unit.

(Item 3) The reference output unit may be configured to change the short-circuit determination reference value to be output, according to the determination result of the polarity.

(Item 4) The reference output unit may be configured to initialize the short-circuit determination reference value to be output, in response to a control signal for driving the control terminal being turned off.

(Item 5) The integration unit may include a plurality of integrators each configured to integrate the output of the sensor, the reference output unit may be configured to output a plurality of short-circuit determination reference values, each of which being identical to the short-circuit determination reference value, that are different from each other corresponding to each of the plurality of integrators, the short-circuit determining apparatus, and the short-circuit determining apparatus may further comprise a selection unit configured to select which of the plurality of integrators is to be used for integration of the output of the sensor, according to the determination result of the polarity.

(Item 6) The selection unit may be configured to initialize a result of the selection, in response to a control signal for driving the control terminal being turned off.

(Item 7) The short-circuit determining apparatus may further comprise a reset unit configured to reset the output of the integration unit when it is detected that the polarity of the output of the sensor has changed from positive to negative.

(Item 8) When it is detected that the polarity of the output of the sensor has changed from positive to negative, the short-circuit determining unit may be configured to determine a short-circuit of the switching device by using a second short-circuit determination reference value different from a first short-circuit determination reference value used before detection.

(Item 9) The second short-circuit determination reference value may be smaller than the first short-circuit determination reference value.

(Item 10) In a case of determining the short-circuit of the switching device by using the second short-circuit determination reference value, when it is detected that the polarity of the output of the sensor has changed from positive to negative, the short-circuit determining unit may be configured to determine the short-circuit of the switching device by using a third short-circuit determination reference value different from the first short-circuit determination reference value and the second short-circuit determination reference value.

(Item 11) The third short-circuit determination reference value may be smaller than the second short-circuit determination reference value.

(Item 12) Each time it is detected that the polarity of the output of the sensor has changed from positive to negative, the short-circuit determining unit may be configured to determine the short-circuit of the switching device by using a new short-circuit determination reference value different from the short-circuit determination reference value used before detection.

(Item 13) The short-circuit determining unit may latch a short-circuit determination signal when the short-circuit of the switching device is detected.

(Item 14) The sensor may be a Rogowskii coil.

(Item 15) The switching device may be a wide bandgap semiconductor device whose main material is at least one of silicon carbide, gallium nitride, gallium oxide and diamond.

(Item 16) A second aspect of the present invention provides a switch apparatus. The switch apparatus may comprise a switching device. The switch apparatus may comprise a control terminal drive unit configured to drive a control terminal of the switching device. The switch apparatus may comprise the short-circuit determining apparatus according to any one of Items 1 to 13.

(Item 17) A third aspect of the present invention provides a short-circuit determining method. The short-circuit determining method may comprise detecting, by a sensor, a time change of a main current flowing between a first main terminal and a second main terminal of a switching device having a control terminal, the first main terminal and the second main terminal. The short-circuit determining method may comprise integrating an output of the sensor. The short-circuit determining method may comprise determining a polarity of the output of the sensor. The short-circuit determining method may comprise determining a short-circuit of the switching device, based on a comparison result of an integrated value of the output of the sensor and a short-circuit determination reference value according to a determination result of the polarity.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention. However, the following embodiments do not limit the invention defined in the claims. Also, all combinations of features described in the embodiments are not necessarily essential to solutions of the invention.

As used herein, the expression such as "provided between A and B" does not limit physical arrangement but means "electrically connected to A and B". As used herein, the expression such as "connected" is not limited to direct connection without another device but includes indirect connection via another device.

Figure 1:
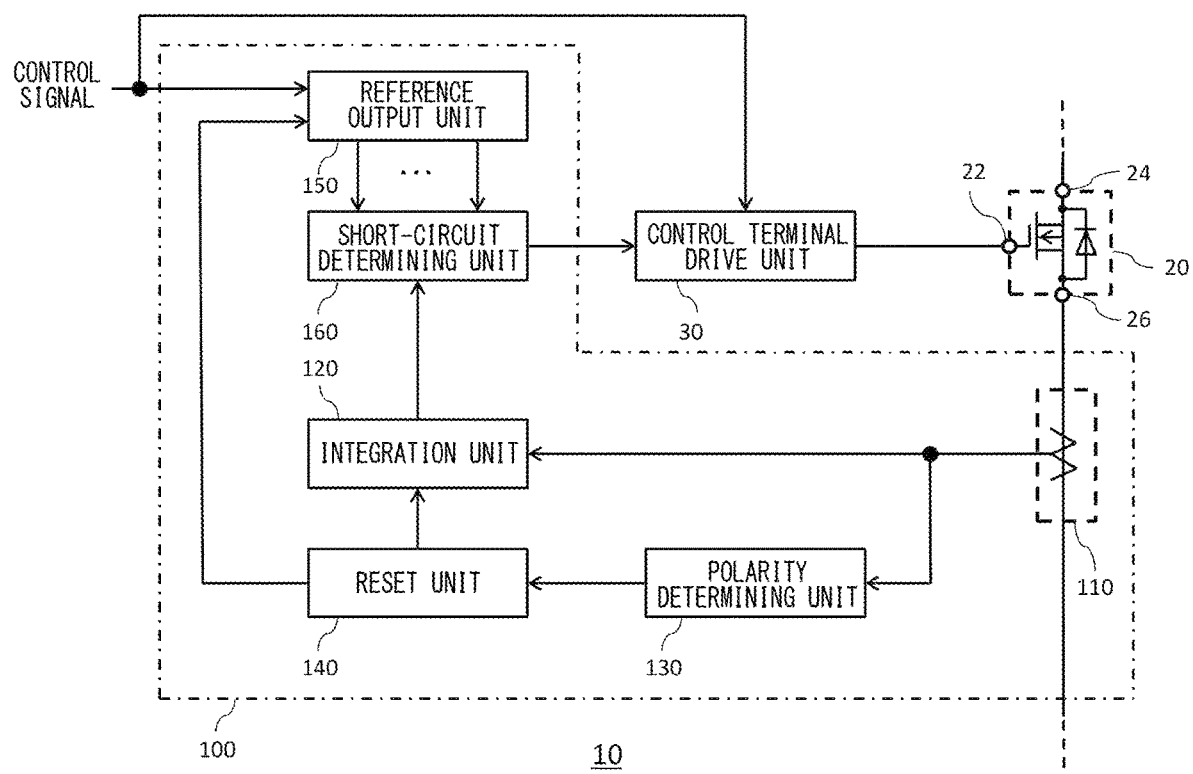
FIG. 1 shows an example of a block diagram of a switch apparatus 10 comprising a short-circuit determining apparatus 100 of the present embodiment.

FIG. 1 shows an example of a block diagram of a switch apparatus 10 comprising a short-circuit determining apparatus 100 according to the present embodiment. In FIG. 1, each block diagram indicates functional blocks that are functionally separated, and may not necessarily match the actual configuration. That is, one block shown in FIG. 1 is not necessarily required to be constituted by one circuit or device. In addition, blocks separately shown in FIG. 1 are not necessarily required to be constituted by separate circuits or devices.

The switch apparatus 10 comprises a switching device 20, a control terminal drive unit 30, and a short-circuit determining apparatus 100.

The switching device 20 may be a wide bandgap semiconductor device whose main material is at least one of silicon carbide, gallium nitride, gallium oxide and diamond. Such a device having a high switching speed generally tends to have a low short-circuit tolerance. Therefore, by targeting such a high-speed device for short-circuit determination, the short-circuit determining apparatus 100 can further enhance effects of the present embodiment.

The switching device 20 has a control terminal 22, a first main terminal 24, and a second main terminal 26, and is configured to electrically connect (on) or disconnect (off) between the first main terminal 24 and the second main terminal 26, according to a voltage or current input to the control terminal 22. As an example, in the present embodiment, the switching device 20 is an nMOS transistor having a gate as the control terminal 22, a drain as the first main terminal 24, and a source as the second main terminal 26, which is turned off when a voltage of the control terminal 22 with reference to the second main terminal 26 (also referred to as 'bias voltage'), i.e., for example, a gate-source voltage Vgs is equal to or lower than a gate threshold voltage, and is turned on when the gate-source voltage Vgs exceeds the gate threshold voltage.

Hereinafter, an example where the switching device 20 is the nMOS transistor is described. However, each embodiment can also be applied to switching devices 20 of diverse types such as a MOS transistor where a control terminal is referred to as a gate and two main terminals are referred to as a drain and a source, an IGBT (insulated gate bipolar transistor) where a control terminal is referred to as a gate and two main terminals are referred to as a collector and an emitter, and a bipolar transistor where a control terminal is referred to as a base and two main terminals are referred to as a collector and an emitter.

The control terminal drive unit 30 is connected to the control terminal 22, for example, the gate of the switching device 20. The control terminal drive unit 30 is supplied with power from a power supply (not shown), and is configured to drive the control terminal 22 of the switching device 20 according to a control signal input from an outside. In this way, the control terminal drive unit 30 switches the on and off states between the first main terminal 24 and the second main terminal 26, for example, between a drain and a source of the switching device 20.

The short-circuit determining apparatus 100 is configured to detect a time change of a main current of the switching device 20. When determining a short-circuit of the switching device 20, based on an integrated value of the time change of the main current, the short-circuit determining apparatus 100 according to the present embodiment uses a short-circuit determination reference value according to a polarity of the time change of the main current.

The short-circuit determining apparatus 100 comprises a sensor 110, an integration unit 120, a polarity determining unit 130, a reset unit 140, a reference output unit 150, and a short-circuit determining unit 160. Here, the short-circuit determining apparatus 100 may be implemented by one or more integrated circuits, or may be implemented by a combination of a plurality of discrete components.

The sensor 110 is configured to detect a time change of a main current flowing between the first main terminal 24 and the second main terminal 26 in the switching device 20 having the control terminal 22, the first main terminal 24 and the second main terminal 26. As an example, the sensor 110 may be a Rogowskii coil. In general, in the Rogowskii coil, an air-core coil is provided around a primary conductor, so that a voltage corresponding to a primary current flowing through the primary conductor is induced at both ends of the coil. At this time, the induced voltage is a time change of the primary current, i.e., a differential waveform (di/dt). Such a Rogowskii coil is preferable because it has no magnetic core and is free of heat generation, saturation and hysteresis due to magnetic loss. In the present embodiment, the sensor 110 may be, as an example, a Rogowskii coil provided around a conductor connected to the second main terminal 26, for example, the source of the switching device 20. The sensor 110 is configured to detect, for example, the voltage induced at both ends of the Rogowskii coil, i.e., the time change of the main current flowing between the first main terminal 24 and the second main terminal 26 of the switching device 20, and to output the same to the integration unit 120 and the polarity determining unit 130.

The integration unit 120 is connected to an output of the sensor 110, and is configured to integrate the output of the sensor 110. As an example, the integration unit 120 may be an RC integrator circuit. However, the present invention is not limited thereto. The integration unit 120 may have any configuration in which the output of the sensor 110 can be integrated, such as an integrator circuit using an operational amplifier, a digital integrator and the like. The integration unit 120 is configured to output an integrated value of the output of the sensor 110 to the short-circuit determining unit 160.

The polarity determining unit 130 is connected to the output of the sensor 110, and is configured to determine a polarity of the output of the sensor 110. As an example, when the time change of the main current of the switching device 20 is greater than a predetermined reference, i.e., when the output voltage of the sensor 110 is higher than a reference voltage (for example, 0 V), the polarity determining unit 130 determines the polarity of the output of the sensor 110 as "positive". When the time change of the main current of the switching device 20 is less than the predetermined reference, i.e., when the output voltage of the sensor 110 is lower than the reference voltage, the polarity determining unit 130 determines the polarity of the output of the sensor 110 as "negative". The polarity determining unit 130 is configured to output a determination result of the polarity obtained by determining the polarity of the output of the sensor 110 to the reset unit 140.

The reset unit 140 is configured to output a reset signal to the integration unit 120, and to reset the output of the integration unit 120. As an example, when it is detected that the polarity of the output of the sensor 110 has changed from positive to negative by the determination result of the polarity output from the polarity determining unit 130, the reset unit 140 sets a reset signal to HIGH to reset the output of the integration unit 120. In response to this, the integration unit 120 sets the output to zero. The reset unit 140 is also configured to output the reset signal to the reference output unit 150, in addition to the integration unit 120. Note that, the reset unit 140 may also set the reset signal to HIGH to reset the output of the integration unit 120 when the polarity of the output of the sensor 110 has changed from positive to negative two or more times or may set the reset signal to HIGH to reset the output of the integration unit 120 after a predetermined time elapsed since the polarity has changed to negative. In order to reset the output after detecting the change in polarity multiple times, the reset unit may be constituted by a comparator, a register circuit, a latch mechanism and the like, for example. In order to reset the output after a predetermined time elapses since detecting the change in polarity, the reset unit may also be constituted by a latch circuit, an integrator circuit, a latch reset circuit and the like, for example.

The reference output unit 150 is configured to output a short-circuit determination reference value, which is used to determine the short-circuit of the switching device 20, to the short-circuit determining unit 160. As an example, the reference output unit 150 is configured to output a first short-circuit determination reference value, as an initial value of the short-circuit determination reference value. In the present embodiment, the reference output unit 150 is configured to change the short-circuit determination reference value to be output, according to a determination result of the polarity by the polarity determining unit 130. For example, in a case where the first short-circuit determination reference value is used to determine the short-circuit of the switching device 20, when it is detected that the polarity of the output of the sensor 110 has changed from positive to negative and the reset signal is set to HIGH, the reference output unit 150 changes the short-circuit determination reference value to be output to a second short-circuit determination reference value different from the first short-circuit determination reference value. At this time, the second short-circuit determination reference value may be smaller than the first short-circuit determination reference value. In a case where the second short-circuit determination reference value is used to determine the short-circuit of the switching device 20, when it is detected that the polarity of the output of the sensor 110 has changed from positive to negative and the reset signal is set to HIGH, the reference output unit 150 changes the short-circuit determination reference value to be output to a third short-circuit determination reference value different from the first short-circuit determination reference value and the second short-circuit determination reference value. At this time, the third short-circuit determination reference value may be smaller than the first short-circuit determination reference value and the second short-circuit determination reference value. The reference output unit 150 is configured to initialize the short-circuit determination reference value to be output, in response to a control signal for driving the control terminal 22 being turned off. That is, the reference output unit 150 is configured to return the short-circuit determination reference value to be output to the first short-circuit determination reference value that is an initial value. This will be described later.

Note that, in the above, a case where the reference output unit 150 detects the change in polarity of the output of the sensor 110 by the reset signal has been described as an example. However, the present invention is not limited thereto. For example, the reference output unit 150 may also be configured to detect the change in polarity of the output of the sensor 110 by directly acquiring the determination result of the polarity by the polarity determining unit 130.

The short-circuit determining unit 160 is configured to determine the short-circuit of the switching device 20. As an example, the short-circuit determining unit 160 is configured to determine the short-circuit of the switching device 20, based on a comparison result of the output of the integration unit 120 and the short-circuit determination reference value output by the reference output unit 150, i.e., the short-circuit determination reference value according to the determination result of the polarity of the output of the sensor 110. For example, in an initial state, the short-circuit determining unit 160 is configured to determine the short-circuit of the switching device 20 by using the first short-circuit determination reference value. In a case where the short-circuit of the switching device 20 is determined using the first short-circuit determination reference value, when it is detected that the polarity of the output of the sensor 110 has changed from positive to negative, the short-circuit determining unit 160 determines the short-circuit of the switching device 20 by using the second short-circuit determination reference value different from the first short-circuit determination reference value used before detection. In addition, in a case where the short-circuit of the switching device 20 is determined using the second short-circuit determination reference value, when it is detected that the polarity of the output of the sensor 110 has changed from positive to negative, the short-circuit determining unit 160 determines the short-circuit of the switching device 20 by using the third short-circuit determination reference value different from the first short-circuit determination reference value and the second short-circuit determination reference value.

The short-circuit determining unit 160 is configured to output a short-circuit determination signal to the control terminal drive unit 30. At this time, when it is detected that the output of the integration unit 120 exceeds the short-circuit determination reference value, the short-circuit determining unit 160 may determine that the switching device 20 is short-circuited, and set the short-circuit determination signal to HIGH. In response to this, the control terminal drive unit 30 cuts off a short-circuit current while suppressing a surge voltage. As an example, the control terminal drive unit 30 may lower the control terminal voltage, for example, the gate-source voltage Vgs of the switching device 20, and cut off the short-circuit current. At this time, the control terminal drive unit 30 may gently lower the control terminal voltage of the switching device 20 to reduce the surge voltage, which is applied to the switching device 20 when cutting off the short-circuit current, thereby preventing breakdown of the switching device 20.

Note that, at this time, the short-circuit determining unit 160 may latch the short-circuit determination signal when the short-circuit of the switching device 20 is detected. That is, the short-circuit determining unit 160 may keep the short-circuit determination signal in a HIGH state when the short-circuit of the switching device 20 is detected. In this way, the short-circuit determining apparatus 100 can prevent the switching device 20 from starting a turn-on operation again before a cause of the short-circuit is solved. In addition, the short-circuit current caused by the short-circuit of the switching device 20 may cause a failure in a load that is driven by the switching device 20. However, the short-circuit determining apparatus 100 can prevent the switching device 20 from starting the turn-on operation again and the short-circuit current from flowing through the load again before the safety on the load-side is conformed.

In this way, when determining the short-circuit of the switching device 20, based on an integrated value of the time change of the main current of the switching device 20, the short-circuit determining apparatus 100 according to the present embodiment uses the short-circuit determination reference value according to the polarity of the time change of the main current. This is described in detail using waveforms.

Figure 2:
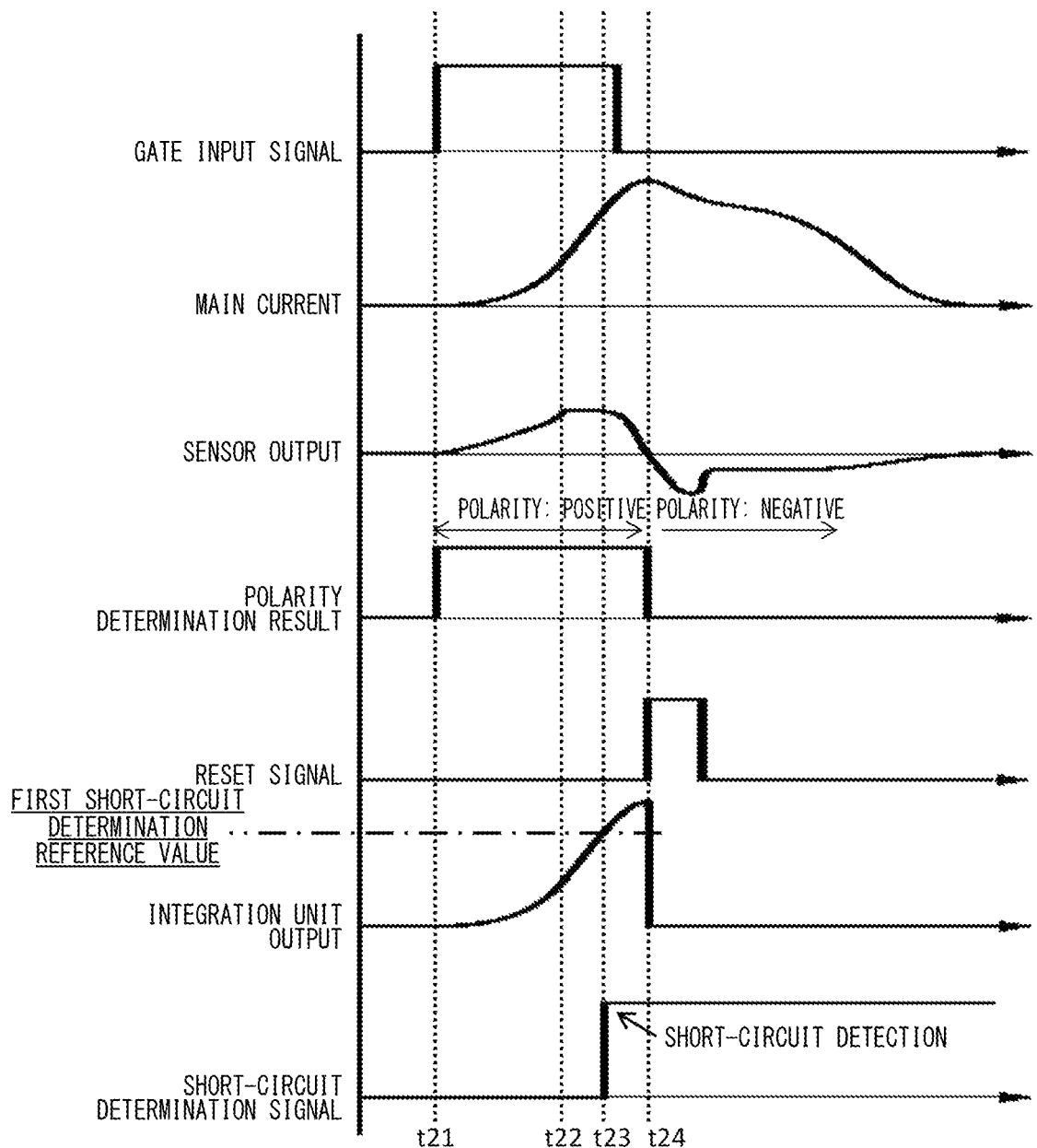
FIG. 2 shows an example of diverse signal waveforms when detecting a short-circuit during a turn-on period by using the short-circuit determining apparatus 100 of the present embodiment.

FIG. 2 shows an example of diverse signal waveforms when detecting a short-circuit during a turn-on period by using the short-circuit determining apparatus 100 according to the present embodiment. In FIG. 2, waveforms of an input signal of the gate as the control terminal 22 of the switching device 20, the main current of the switching device 20, the output voltage of the sensor 110, the determination result of the polarity obtained by the polarity determining unit 130, the reset signal output by the reset unit 140, the output of the integration unit 120, and the short-circuit determination signal output by the short-circuit determining unit 160 are sequentially shown from above.

In response to the control signal being turned on, the control terminal drive unit 30 turns on the input signal of the gate as the control terminal 22 of the switching device 20 at time t21, thereby driving the control terminal 22 of the switching device 20. In response to this, the control terminal voltage, for example, the gate-source voltage Vgs of the switching device 20 starts to rise. Then, when the control terminal voltage exceeds a gate threshold voltage, the switching device 20 starts to turn on. FIG. 2 shows an example of the diverse signal waveforms when the switching device 20 is short-circuited due to any cause during a turn-on period, i.e., during a period ranging from the start of the turn-on of the switching device 20 to a point where a steady state is reached. During this turn-on period, the reference output unit 150 outputs the first short-circuit determination reference value that is an initial value to the short-circuit determining unit 160, as the short-circuit determination reference value. Then, the short-circuit determining unit 160 determines the short-circuit of the switching device 20, based on a comparison result of the output of the integration unit 120 and the first short-circuit determination reference value.

When the switching device 20 starts to turn on, the main current starts to flow through the switching device 20. In this way, since the output voltage of the sensor 110 becomes higher than 0 V that is the reference voltage, the polarity determining unit 130 determines that the polarity of the output of the sensor 110 is "positive".

At time t22, it is assumed that the time change of the main current becomes constant. Therefore, the output voltage of the sensor 110 becomes constant at this point of time. However, the output of the integration unit 120 configured to integrate the output of the sensor 110 still continues to increase.

At time t23, when it is detected that the output of the integration unit 120 exceeds the first short-circuit determination reference value as a result of the comparison of the output of the integration unit 120 and the first short-circuit determination reference value, the short-circuit determining unit 160 determines that the switching device 20 is short-circuited. Then, the short-circuit determining unit 160 sets the short-circuit determination signal to HIGH, which indicates that the switching device 20 is short-circuited. At this time, as described above, when the short-circuit of the switching device 20 is detected, the short-circuit determining unit 160 may keep the short-circuit determination signal in the HIGH state and latch the short-circuit determination signal.

In this way, when the short-circuit of the switching device 20 is detected at time t23 and the short-circuit determination signal is set to HIGH, the control terminal drive unit 30 lowers the control terminal voltage, for example, the gate-source voltage Vgs of the switching device 20, and cuts off the short-circuit current. In response to this, since the increase in the main current of the switching device 20 becomes gentle, the output voltage of the sensor 110 configured to detect the time change of the main current starts to decrease.

At time t24, when it is detected that the output voltage of the sensor 110 becomes lower than 0 V that is the reference voltage, the polarity determining unit 130 changes the determination result of the polarity from HIGH, which indicates that the polarity is "positive", to LOW, which indicates that the polarity is "negative". In response to this, the reset unit 140 sets the reset signal to HIGH to reset the output of the integration unit 120 to zero.

In this way, during the turn-on period, the short-circuit determining apparatus 100 according to the present embodiment determines the short-circuit of the switching device 20 by using the first determination reference value that is an initial value, as the short-circuit determination reference value.

Figure 3:
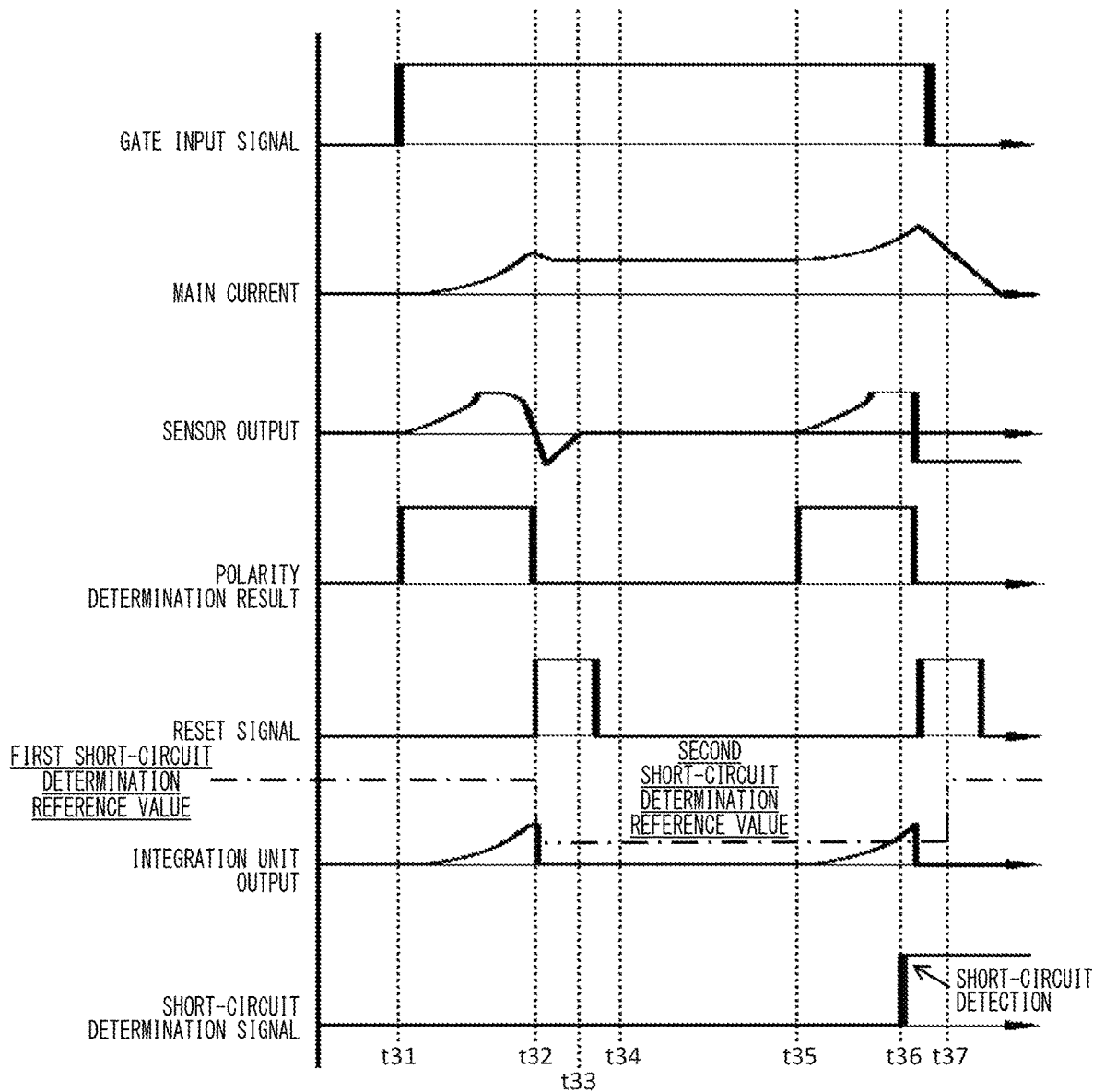
FIG. 3 shows an example of diverse signal waveforms when detecting a short-circuit during a steady current passing period by using the short-circuit determining apparatus 100 of the present embodiment.

FIG. 3 shows an example of diverse signal waveforms when detecting a short-circuit during a steady current passing period by using the short-circuit determining apparatus 100 of the present embodiment.

At time t31, the switching device 20 starts to turn on. Since an operation at time t31 is the same as the operation at time t21 of FIG. 2, the description thereof is omitted. FIG. 3 shows an example of the diverse signal waveforms when the switching device 20 is short-circuited due to any cause after shifting to a steady state without short-circuit during the turn-on period, i.e., during a steady current passing period in which the steady current flows through the switching device 20. When the turn-on operation is normally performed and the main current of the switching device 20 reaches a certain current value, the increase in the main current becomes gentle, so that the output voltage of the sensor 110 configured to detect the time change of the main current starts to decrease.

At time t32, when it is detected that the output voltage of the sensor 110 becomes lower than 0 V that is the reference voltage, the polarity determining unit 130 changes the determination result of the polarity from HIGH to LOW. Note that, when the operation is normally performed without short-circuit during the turn-on period, the output of the integration unit 120 does not exceed the first short-circuit determination reference value during a period from time t31 to time t32. In response to this, the reset unit 140 sets the reset signal to HIGH to reset the output of the integration unit 120.

Here, as described above, the reset unit 140 outputs the reset signal also to the reference output unit 150, in addition to the integration unit 120. Therefore, at this point of time, the reference output unit 150 detects that the polarity of the output of the sensor 110 has changed from positive to negative. Thereby, the reference output unit 150 changes the short-circuit determination reference value to be output from the first short-circuit determination reference value that is an initial value to the second short-circuit determination reference value. At this time, the second short-circuit determination reference value may be smaller than the first short-circuit determination reference value.

At time t33, when a transient response converges and the main current flowing through the switching device 20 becomes stable as the steady current, the output voltage of the sensor 110 becomes 0 V that is the reference voltage. Thereafter, the reset unit 140 returns the reset signal from HIGH to LOW to release the reset operation of the integration unit 120.

At time t34, the output of the integration unit 120 becomes stable. Thereafter, the output of the integration unit 120 remains constant without changing from the value at time t34 as long as the main current of the switching device 20 does not change and remains as the steady current. In this way, during the steady current passing period in which the steady current flows through the switching device 20, the short-circuit determining unit 160 compares the output of the integration unit 120 and the second short-circuit determination reference value to determine the short-circuit during the steady current passing period. That is, the short-circuit determining unit 160 determines whether the output of the integration unit 120 exceeds the second short-circuit determination reference value, with reference to the output of the integration unit 120 at time t34.

At time t35, when the switching device 20 is short-circuited due to any cause, the main current of the switching device 20 starts to increase from the steady current. Thereby, since the output voltage of the sensor 110 becomes higher than 0 V that is the reference voltage, the polarity determining unit 130 determines that the polarity of the output of the sensor 110 is "positive".

At time t36, when it is detected that the output of the integration unit 120 exceeds the second short-circuit determination reference value as a result of the comparison of the output of the integration unit 120 and the second short-circuit determination reference value, the short-circuit determining unit 160 determines that the switching device 20 is short-circuited. Then, the short-circuit determining unit 160 sets the short-circuit determination signal to HIGH, which indicates that the switching device 20 is short-circuited. At this time, as described above, when the short-circuit of the switching device 20 is detected, the short-circuit determining unit 160 may keep the short-circuit determination signal in the HIGH state and latch the short-circuit determination signal.

In this way, when the short-circuit of the switching device 20 is detected at time t36 and the short-circuit determination signal is set to HIGH, the control terminal drive unit 30 lowers the control terminal voltage, for example, the gate-source voltage Vgs of the switching device 20, and cuts off the short-circuit current. In response to this, since the increase in main current of the switching device 20 becomes gentle, the output voltage of the sensor 110 configured to detect the time change of the main current starts to decrease. Then, when it is detected that the output voltage of the sensor 110 becomes lower than 0 V that is the reference voltage, the polarity determining unit 130 changes the determination result of the polarity from HIGH to LOW. In response to this, the reset unit 140 sets the reset signal to HIGH to reset the output of the integration unit 120 to zero.

At time t37, in response to the control signal being turned off, the reference output unit 150 initializes the short-circuit determination reference value to be output. That is, the reference output unit 150 returns the short-circuit determination reference value to be output from the second short-circuit determination reference value to the first short-circuit determination reference value that is an initial value.

In this way, the short-circuit determining apparatus 100 according to the present embodiment detects the short-circuit during the steady current passing period, i.e., that the short-circuit state occurred after the turn-on operation is normally performed and the switching device 20 is shifted to the steady state, by using the second determination reference value different from the first determination reference value.

Note that, in the above, a case where the main current is constant without changing from the steady current during the period from time t33 to time t35 has been described as an example. However, the present invention is not limited thereto. For example, it is assumed that the main current of the switching device 20 slightly increases or decreases from the steady current within a range in which the output of the integration unit 120 does not exceed the second short-circuit determination reference value, after time t34. At this time, the polarity determining unit 130 can detect that the polarity of the output of the sensor 110 has changed from positive to negative. In this case, the reset unit 140 may set the reset signal to HIGH to reset the output of the integration unit 120, in a similar manner to the above case. In response to this, the reference output unit 150 may change the short-circuit determination reference value to be output from the second short-circuit determination reference value to the third short-circuit determination reference value different from the first short-circuit determination reference value and the second short-circuit determination reference value. At this time, the third short-circuit determination reference value may be smaller than the first short-circuit determination reference value and the second short-circuit determination reference value. The short-circuit determining unit 160 may determine the short-circuit of the switching device 20 by using the third short-circuit determination reference value. That is, when resetting the output of the integration unit 120 after time t34, the short-circuit determining unit 160 may determine whether the output of the integration unit 120 exceeds the third short-circuit determination reference value smaller than the second short-circuit determination reference value, with reference to the output of the integration unit 120 at a point of time at which the output of the integration unit 120 becomes stable after the reset. In this way, when the output of the integration unit 120 is reset during the steady current passing period, the short-circuit determining unit 160 may further reduce the short-circuit determination reference value to determine the short-circuit of the switching device 20, taking the increase in main current to be integrated into consideration. Therefore, it is possible to determine the short-circuit by using fourth or more short-circuit determination reference values, according to the number of reset times. A predetermined value is used for each of the short-circuit determination reference values, or each of the short-circuit determination reference values is determined based on the current or voltage of the switching device, a parasitic inductance of a main circuit, and the like. The short-circuit determination reference value different from the short-circuit determination reference value before the reset may also be selected from the plurality of short-circuit determination reference values, irrespective of the number of reset times. In addition, until the control signal becomes off, each time it is detected that the polarity of the output of the sensor 110 has changed from positive to negative, the short-circuit of the switching device 20 may be determined using the short-circuit determination reference value different from the previous short-circuit determination reference values.

As described above, when determining the short-circuit of the switching device 20, based on the integrated value of the time change of the main current, the short-circuit determining apparatus 100 according to the present embodiment uses the short-circuit determination reference value according to the polarity of the time change of the main current. In this way, according to the short-circuit determining apparatus 100 of the present embodiment, it is possible to determine more appropriately the short-circuit of the switching device 20, according to the operating situations, as compared to a case where the short-circuit is determined using one reference value. In particular, the short-circuit determining apparatus 100 according to the present embodiment uses, as the short-circuit determination reference value, the first short-circuit determination reference value that is an initial value, in the initial state, and uses, as the short-circuit determination reference value, the second short-circuit determination reference value smaller than the first short-circuit determination reference value when it is detected that the polarity of the output of the sensor 110 has changed from positive to negative. That is, the short-circuit determining apparatus 100 according to the present embodiment determines the short-circuit during the turn-on period by using the first short-circuit determination reference value, and determines the short-circuit during the steady current passing period by using the second short-circuit determination reference value smaller than the first short-circuit determination reference value. In this way, according to the short-circuit determining apparatus 100 of the present embodiment, it is possible to promptly detect both the short-circuit during the turn-on period and the short-circuit during the steady current passing period.

Figure 4:
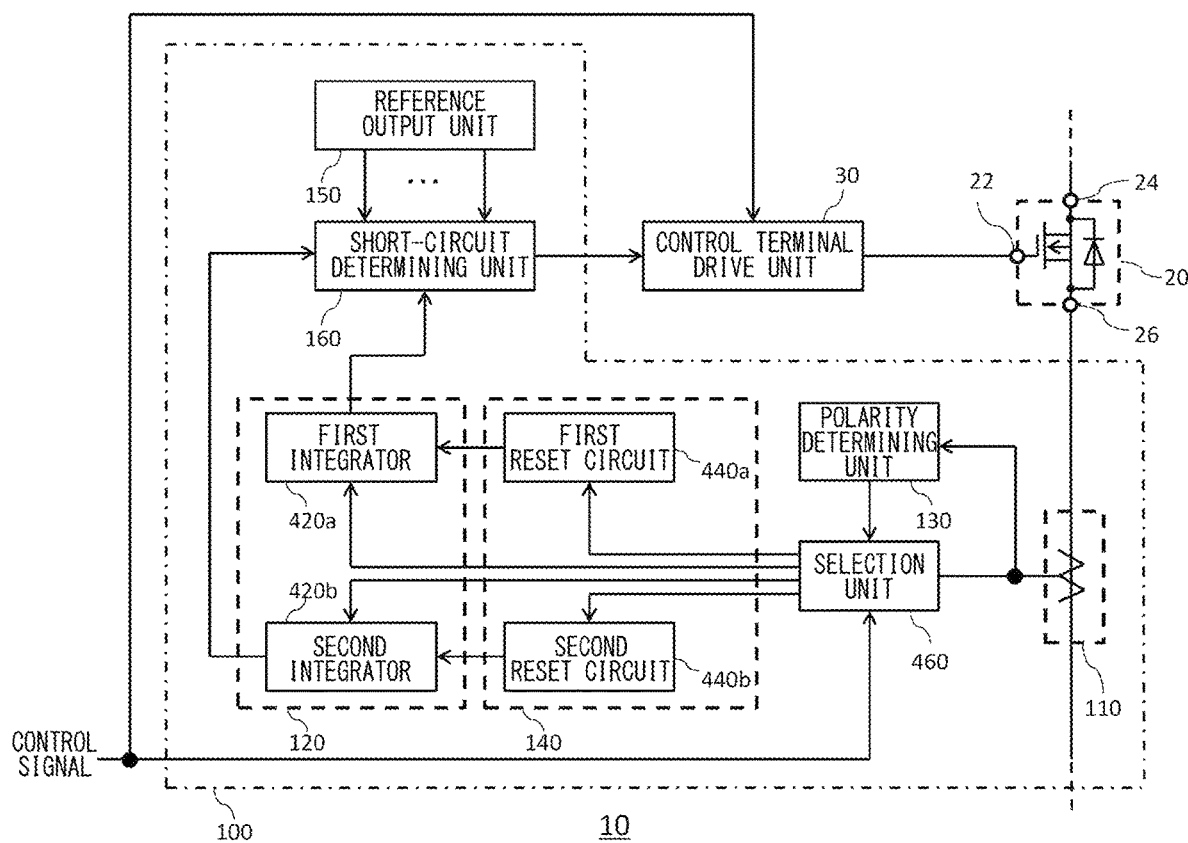
FIG. 4 shows an example of a block diagram of the switch apparatus 10 comprising the short-circuit determining apparatus 100 of a modified embodiment of the present embodiment.

FIG. 4 shows an example of a block diagram of the switch apparatus 10 comprising the short-circuit determining apparatus 100 according to a modified embodiment of the present embodiment. In FIG. 4, the members having the same functions and configurations as FIG. 1 are denoted with the same reference signs, and the overlapping descriptions are omitted except differences. The short-circuit determining apparatus 100 according to the above-described embodiment determines the short-circuit according to the situations by changing the short-circuit determination reference value according to the determination result of the polarity. However, the short-circuit determining apparatus 100 according to the present modified embodiment determines the short-circuit according to the situations by selectively switching a plurality of integrators respectively associated with short-circuit determination reference values that are different from each other, according to the determination result of the polarity.

In the present modified embodiment, the integration unit 120 has a plurality of integrators 420 each configured to integrate the output of the sensor 110. FIG. 4 shows a case where the integration unit 120 has a first integrator 420a and a second integrator 420b (collectively referred to as "integrators 420"), as an example. In the present modified embodiment, the reset unit 140 has a plurality of reset circuits 440 corresponding to the plurality of integrators 420. FIG. 4 shows a case where the reset unit 140 has a first reset circuit 440a and a second reset circuit 440b (collectively referred to as "reset circuits 440"), as an example. Note that, in the above, the case where the two integrators 420 and the two reset circuits 440 are each provided is shown as an example. However, the present invention is not limited thereto. For example, the numbers of the integrators 420 and the reset circuits 440 may be each three or more. Also, in the above, the case where the plurality of reset circuits 440 each corresponding to each of the plurality of integrators 420 is provided is shown as an example. However, the present invention is not limited thereto. While the integration unit 120 may have the plurality of integrators 420, the reset unit 140 may have only one reset circuit 440. That is, the plurality of integrators 420 may share one reset circuit 440.

In the present modified embodiment, the reference output unit 150 is configured to output the plurality of short-circuit determination reference values that are different from each other, each corresponding to each of the plurality of integrators 420 to the short-circuit determining unit 160. As an example, the reference output unit 150 according to the present modified embodiment may be configured to output the first short-circuit determination reference value, as the short-circuit determination reference value corresponding to the first integrator 420*a*. The reference output unit 150 of the present modified embodiment may also be configured to output the second short-circuit determination reference value, as the short-circuit determination reference value corresponding to the second integrator 420*b*. That is, in the present modified embodiment, the short-circuit determining unit 160 may be configured to compare an output of the first integrator 420*a* and the first short-circuit determination reference value and to compare an output of the second integrator 420*b* and the second short-circuit determination reference value.

Also, in the present modified embodiment, the short-circuit determining apparatus 100 further comprises a selection unit 460 configured to select which of the plurality of integrators 420 is to be used for integration of the output of the sensor 110, according to the determination result of the polarity of the output of the sensor 110. As an example, in the initial state, the selection unit 460 may be configured to select the first integrator 420*a* as the integrator 420 that is used for integration of the output of the sensor 110, and to connect the output of the sensor 110 to the first integrator 420*a*. The selection unit 460 may also be configured to connect the output of the polarity determining unit 130 to the first reset circuit 440*a*. Note that, when it is detected that the polarity of the output of the sensor 110 has changed from positive to negative and the turn-on period is shifted to the steady current passing period, the selection unit 460 may select the second integrator 420*b* as the integrator 420 that is used for integration of the output of the sensor 110, and connect the output of the sensor 110 to the second integrator 420*b*. The selection unit 460 may also be configured to connect the output of the polarity determining unit 130 to the second reset circuit 440*b*. The selection unit 460 may also be configured to initialize a result of the selection, in response to the control signal for driving the control terminal being turned off. That is, the selection unit 460 may be configured to connect the output of the sensor 110 to the first integrator 420*a* and to again connect the output of the polarity determining unit 130 to the first reset circuit 440*a*, in response to the control signal being turned off.

Figure 5:
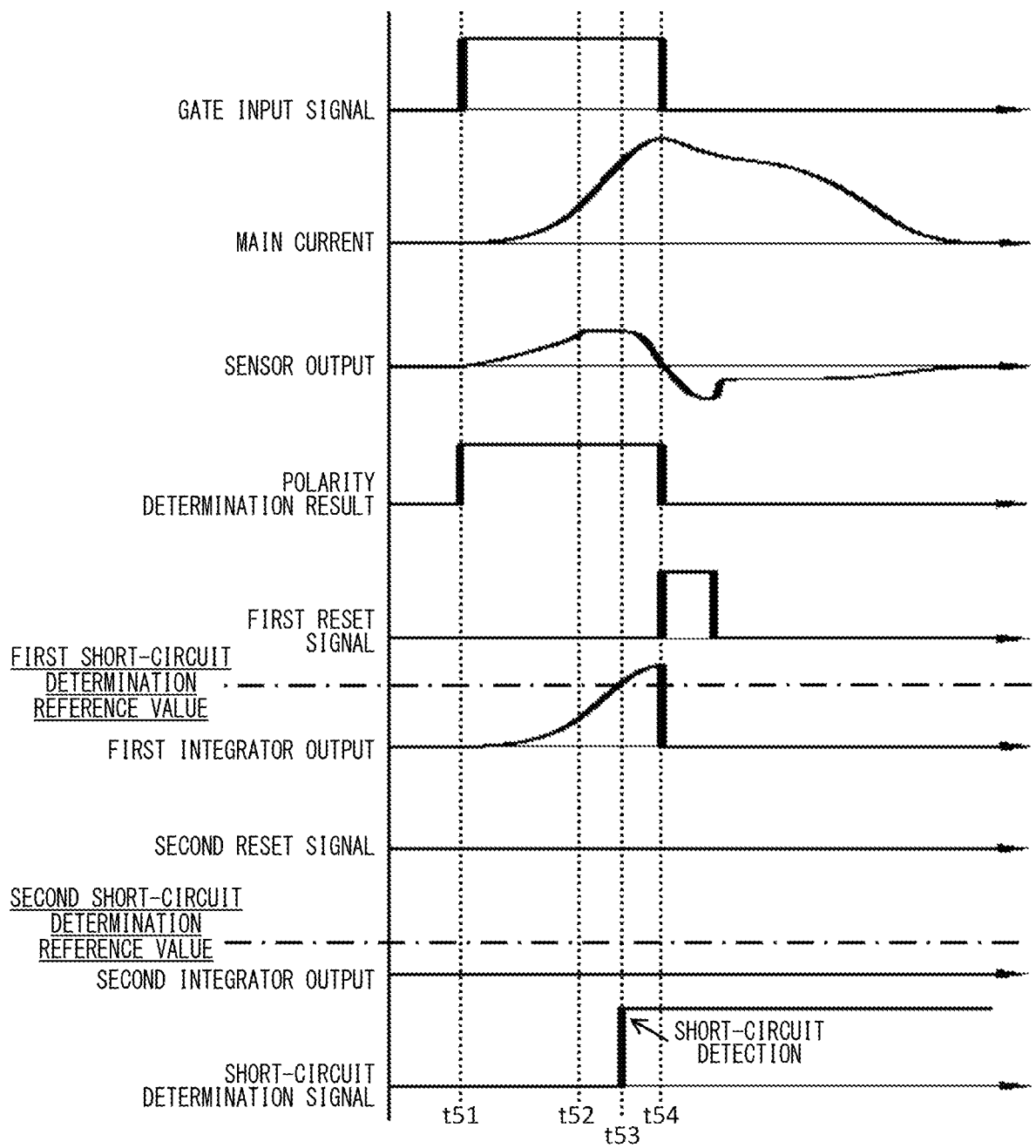
FIG. 5 shows an example of diverse signal waveforms when detecting a short-circuit during the turn-on period by using the short-circuit determining apparatus 100 of the modified embodiment of the present embodiment.

FIG. 5 shows an example of diverse signal waveforms when detecting a short-circuit during the turn-on period by using the short-circuit determining apparatus 100 of the modified embodiment according to the present embodiment. In FIG. 5, waveforms of an input signal of the gate as the control terminal 22 of the switching device 20, the main current of the switching device 20, the output voltage of the sensor 110, the determination result of the polarity by the polarity determining unit 130, a first reset signal output by the first reset circuit 440*a*, an output of the first integrator 420*a*, a second reset signal output by the second reset circuit 440*b*, an output of the second integrator 420*b*, and the short-circuit determination signal output by the short-circuit determining unit 160 are sequentially shown from above.

In the present modified embodiment, the operation during the turn-on period is similar to the operation in the above embodiment, and the first integrator 420*a* and the first reset circuit 440*a* each perform the controls similar to the integration unit 120 and the reset unit in the above embodiment. Note that, at this time, the second integrator 420*a* and the second reset circuit 440*b* are not particularly involved in the control.

Figure 6:
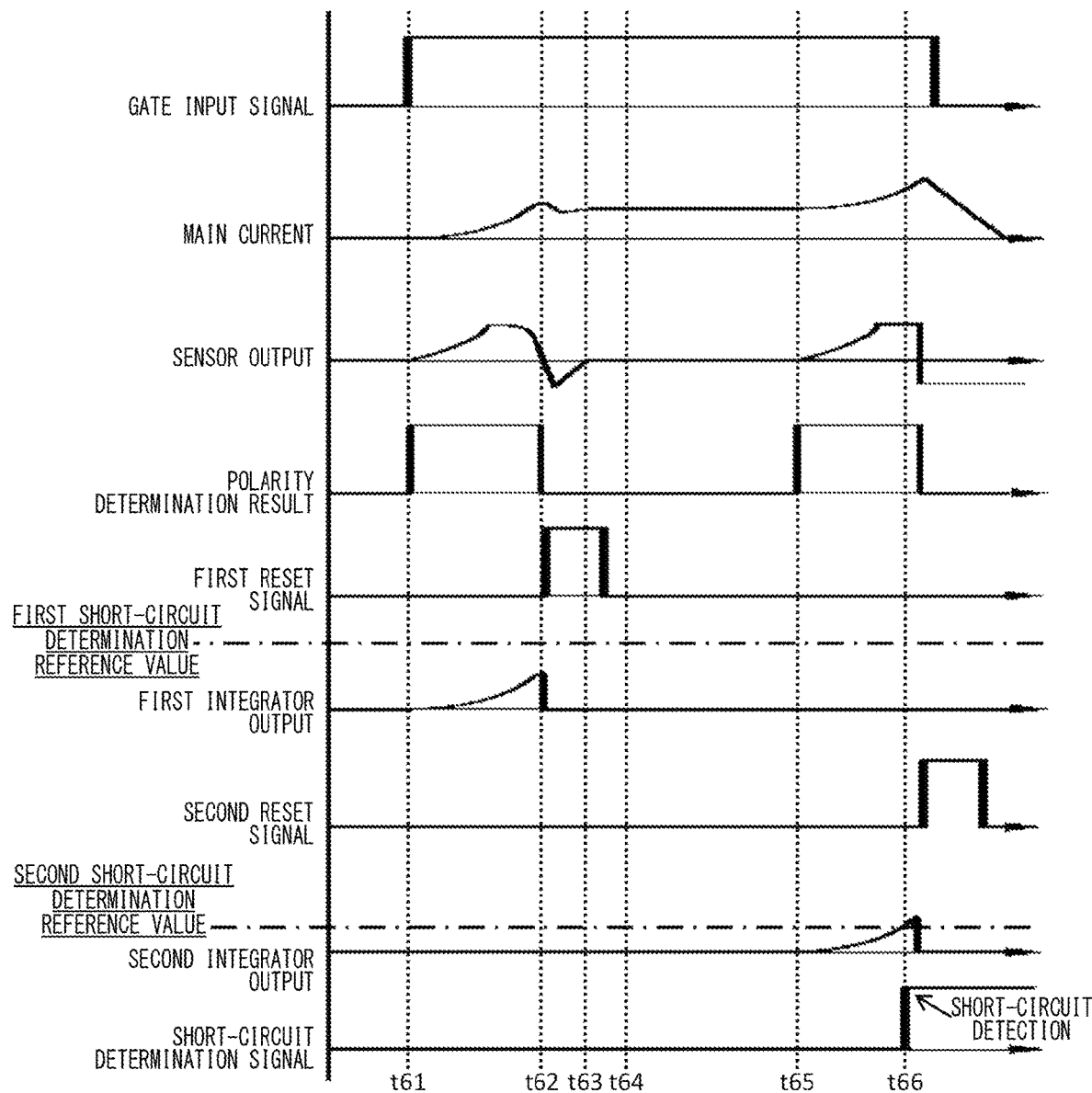
FIG. 6 shows an example of diverse signal waveforms when detecting a short-circuit during the steady current passing period by using the short-circuit determining apparatus 100 of the modified embodiment of the present embodiment.

FIG. 6 shows an example of diverse signal waveforms when detecting a short-circuit during the steady current passing period by using the short-circuit determining apparatus 100 of the modified embodiment according to the present embodiment. In the present modified embodiment, during the turn-on period, the first integrator 420*a* and the first reset circuit 440*a* are responsible for the integral control of the output of the sensor 110. On the other hand, at time t62, when it is detected that the polarity of the output of the sensor 110 has changed positive to negative and the turn-on period is shifted to the steady current passing period, the selection unit 460 switches the initial state where the first integrator 420*a* and the second reset circuit 440*a* are responsible for the integral control to a state where the second integrator 420*b* and the second reset circuit 440*b* are responsible for the integral control. That is, in the present modified embodiment, the short-circuit at time t66 is detected based on the output of the second integrator 420.

In this way, the short-circuit determining apparatus 100 according to the present modified embodiment selectively switches the plurality of integrators 420 respectively associated with short-circuit determination reference values that are different from each other, according to the determination result of the polarity. Thereby, the short-circuit determining apparatus 100 according to the present modified embodiment can determine the short-circuit according to the situations by switching the integrators 420, without changing the short-circuit determination reference value during the control. Since the short-circuit determining apparatus 100 according to the present modified embodiment uses the plurality of integrators 420, it is possible to perform the operation at high-speed by removing the influence of the time on the reset operations of the integrators 420.

Note that, in the above, the case where the plurality of short-circuit determination references that are different from each other is respectively set for each of the plurality of integrators 420 is shown as an example. However, the present invention is not limited thereto. The short-circuit determining apparatus 100 according to the present modified embodiment may share one short-circuit determination reference for the plurality of integrators 420 and set time constants of the integrators 420 to different values, thereby achieving the similar effects.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: switch apparatus
20: switching device
22: control terminal
24: first main terminal
26: second main terminal
30: control terminal drive unit
100: short-circuit determining apparatus
110: sensor
120: integration unit
130: polarity determining unit
140: reset unit
150: reference output unit
160: short-circuit determining unit
420: integrator
440: reset circuit
460: selection unit

What is claimed is:

1. A short-circuit determining apparatus comprising:
a sensor configured to detect a time change of a main current flowing between a first main terminal and a second main terminal of a switching device having a control terminal, the first main terminal and the second main terminal;
an integration unit configured to integrate an output of the sensor;
a polarity determining unit configured to determine a polarity of the output of the sensor; and
a short-circuit determining unit configured to determine a short-circuit of the switching device, based on a comparison result of an output of the integration unit and a short-circuit determination reference value according to a determination result of the polarity.

2. The short-circuit determining apparatus according to claim 1, further comprising a reference output unit configured to output the short-circuit determination reference value to the short-circuit determining unit.

3. The short-circuit determining apparatus according to claim 2, wherein
the reference output unit is configured to change the short-circuit determination reference value to be output, according to the determination result of the polarity.

4. The short-circuit determining apparatus according to claim 3, wherein
the reference output unit is configured to initialize the short-circuit determination reference value to be output, in response to a control signal for driving the control terminal being turned off.

5. The short-circuit determining apparatus according to claim 2, wherein
the integration unit includes a plurality of integrators each configured to integrate the output of the sensor, and
the reference output unit is configured to output a plurality of short-circuit determination reference values, each of which being identical to the short-circuit determination reference value, that are different from each other corresponding to each of the plurality of integrators,
the short-circuit determining apparatus further comprising a selection unit configured to select which of the plurality of integrators is to be used for integration of the output of the sensor, according to the determination result of the polarity.

6. The short-circuit determining apparatus according to claim 5, wherein
the selection unit is configured to initialize a result of the selection, in response to a control signal for driving the control terminal being turned off.

7. The short-circuit determining apparatus according to claim 1, further comprising a reset unit configured to reset the output of the integration unit when it is detected that the polarity of the output of the sensor has changed from positive to negative.

8. The short-circuit determining apparatus according to claim 2, further comprising a reset unit configured to reset the output of the integration unit when it is detected that the polarity of the output of the sensor has changed from positive to negative.

9. The short-circuit determining apparatus according to claim 7, wherein
when it is detected that the polarity of the output of the sensor has changed from positive to negative, the short-circuit determining unit is configured to determine a short-circuit of the switching device by using a second short-circuit determination reference value different from a first short-circuit determination reference value used before detection.

10. The short-circuit determining apparatus according to claim 9, wherein
the second short-circuit determination reference value is smaller than the first short-circuit determination reference value.

11. The short-circuit determining apparatus according to claim 9, wherein
in a case of determining the short-circuit of the switching device by using the second short-circuit determination reference value, when it is detected that the polarity of the output of the sensor has changed from positive to negative, the short-circuit determining unit is configured to determine the short-circuit of the switching device by using a third short-circuit determination reference value different from the first short-circuit determination reference value and the second short-circuit determination reference value.

12. The short-circuit determining apparatus according to claim 10, wherein
in a case of determining the short-circuit of the switching device by using the second short-circuit determination reference value, when it is detected that the polarity of the output of the sensor has changed from positive to negative, the short-circuit determining unit is configured to determine the short-circuit of the switching device by using a third short-circuit determination reference value different from the first short-circuit determination reference value and the second short-circuit determination reference value.

13. The short-circuit determining apparatus according to claim 11, wherein
the third short-circuit determination reference value is smaller than the second short-circuit determination reference value.

14. The short-circuit determining apparatus according to claim 11, wherein
each time it is detected that the polarity of the output of the sensor has changed from positive to negative, the short-circuit determining unit is configured to determine the short-circuit of the switching device by using a new short-circuit determination reference value different from the short-circuit determination reference value used before detection.

15. The short-circuit determining apparatus according to claim 13, wherein each time it is detected that the polarity of the output of the sensor has changed from positive to negative, the short-circuit determining unit is configured to determine the short-circuit of the switching device by using a new short-circuit determination reference value different from the short-circuit determination reference value used before detection.

16. The short-circuit determining apparatus according to claim 1, wherein
the short-circuit determining unit is configured to latch a short-circuit determination signal when the short-circuit of the switching device is detected.

17. The short-circuit determining apparatus according to claim 1, wherein
the sensor is a Rogowskii coil.

18. The short-circuit determining apparatus according to claim 1, wherein
the switching device is a wide bandgap semiconductor device whose main material is at least one of silicon carbide, gallium nitride, gallium oxide and diamond.

19. A switch apparatus comprising:
the switching device;
a control terminal drive unit configured to drive the control terminal of the switching device; and
the short-circuit determining apparatus according to claim 1.

20. A short-circuit determining method comprising:
detecting, by a sensor, a time change of a main current flowing between a first main terminal and a second main terminal of a switching device having a control terminal, the first main terminal and the second main terminal;
integrating an output of the sensor;
determining a polarity of the output of the sensor; and
determining a short-circuit of the switching device, based on a comparison result of an integrated value of the output of the sensor and a short-circuit determination reference value according to a determination result of the polarity.

* * * * *